(12) United States Patent
Yeo et al.

(10) Patent No.: US 6,339,631 B1
(45) Date of Patent: Jan. 15, 2002

(54) SHIFT REGISTER

(75) Inventors: Ju Cheon Yeo; Jin Sang Kim, both of Anyang (KR)

(73) Assignee: LG. Philips Lcd Co., Ltd., Seoul (KR)

( * ) Notice: Subject to any disclaimer, the term of this patent is extended or adjusted under 35 U.S.C. 154(b) by 0 days.

(21) Appl. No.: 09/517,267

(22) Filed: Mar. 2, 2000

(30) Foreign Application Priority Data

Mar. 2, 1999 (KR) .............................................. 99-6764

(51) Int. Cl.$^7$ .............................................. G11C 19/00
(52) U.S. Cl. .............................. 377/64; 377/69; 377/70; 377/75
(58) Field of Search .............................. 377/64, 67, 69, 377/70, 73–75, 77–80

(56) References Cited

U.S. PATENT DOCUMENTS

| | | | | |
|---|---|---|---|---|
| 5,136,622 A | * | 8/1992 | Plus | 377/64 |
| 5,222,082 A | * | 6/1993 | Plus | 377/79 |
| 5,434,899 A | * | 7/1995 | Huq et al. | 377/78 |
| 6,064,713 A | * | 5/2000 | Lebrun et al. | 377/67 |

* cited by examiner

*Primary Examiner*—Tuan T. Lam
(74) *Attorney, Agent, or Firm*—Long Aldridge & Norman LLP

(57) ABSTRACT

A shift register that is suitable for reducing the required number of clock signals as well as simplifying the configuration of an external control circuit uses a plurality of stages connected, in series, to a start pulse input line. In each stage, an output circuit responds to a first control signal to apply any one of first and second clock signals to a row line of a liquid crystal cell array and thus to charge the low line of the liquid crystal cell array, and responds to a second control signal to discharge a voltage at the row line. An output circuit responds to a clock signal different from any one of the start pulse and an output signal of the previous stage to generate the first control signal, and responds to a clock signal different from the first control signal to generate the second control signal.

15 Claims, 10 Drawing Sheets

SHIFT REGISTER

BACKGROUND OF THE INVENTION

1. Field of the Invention

This invention relates to a driving circuit for an active matrix display device, and more particularly to a shift register for driving pixel rows of a liquid crystal display device.

2. Description of the Related Art

A liquid crystal display (LCD) used as a display device for a television and a computer includes a liquid crystal matrix having liquid crystal cells arranged at intersections of data lines (i.e., column lines) with selection lines (i.e., row lines). These selection lines are horizontal lines (i.e., row lines) of the liquid crystal matrix and are selected by a shift register.

As shown in FIG. 1, the conventional shift register includes n stages $2_1$ to $2_n$ that are connected in cascade and that are connected, via output lines $4_1$ to $4_{n-1}$, to n row lines $ROW_1$ to $ROW_n$, respectively. The first stage $2_1$ receives a start pulse SP, and the second to $n^{th}$ stages $2_2$ to $2_n$ receive output signals $g_1$ to $g_{n-1}$ of the previous stages $2_1$ to $2_{n-1}$. Also, the $1^{st}$ to $n^{th}$ stages $2_1$ to $2_n$ shift the start pulse SP, or the output signals $g_1$ to $g_{n-1}$ of the previous stages $2_1$ to $2_{n-1}$, respectively, by two of three clock signals C1 to C3, thereby sequentially enabling row lines $ROW_i$ connected to the pixel rows.

As shown in FIG. 2, each of the stages $2_1$ to $2_n$ in FIG. 1 includes a fifth NMOS transistor T5 for applying a high logic level voltage signal to an output line $4i$, and a sixth NMOS transistor T6 for applying a low logic level voltage signal to the output line $4i$. Also, each stage $2_i$ includes a first NMOS transistor T1 for receiving the start pulse SP, or an output signal $g_{i-1}$ of the previous stage $2_{i-1}$ at gate and drain terminals thereof, and a third NMOS transistor T3 for receiving the third clock signal C3 at the gate terminal thereof. The third clock signal C3 is changed from a low logic level into a high logic level simultaneously with the output signal $g_{i-1}$, of the previous stage $2_{i-1}$. Accordingly, the third NMOS transistor T3 and the fourth NMOS transistor T4 are simultaneously turned on. Since the W/L ratio of the fourth NMOS transistor T4 (wherein W is a channel width and L is a channel length) is larger than that of the third NMOS transistor T3, a voltage VP2 at a second node P2 has a low logic level close to the ground voltage level. As described above, the stages $2_1$ to $2_n$ included in the conventional shift register have a ratio logic. Since a voltage VP1 at a first node P1 has a voltage level close to the output signal $g_{i-1}$ of the previous stage $2_{i-1}$ input via the first NMOS transistor T1, a fifth NMOS transistor T5 is turned on. At this time, the first clock signal C1 maintains a low logic level, so that a low logic level voltage signal appears at the output line $4_i$.

If the first clock signal C1 changes from a low logic level to a high logic level while the voltage VP1 at the first node P1 remains at a high logic level, the output line $4_i$ charges to the high logic level voltage of the first clock signal C1 input via the fifth NMOS transistor T5. At this time, the first node P1 is coupled to the output terminal $4_i$ by a parasitic capacitor $C_{gs}$ existing between the gate terminal and the drain terminal of the fifth NMOS transistor T5, thereby allowing a charge voltage VP1 at the first node P1 to be raised to a higher level.

Accordingly, a high logic level voltage of the first clock signal C1 is applied to the output line $4_i$ without loss. The first and fourth NMOS transistors T1 and T4 are turned off by the output signal $g_{i-1}$ of the previous stage $2_{i-1}$ changing from a high logic level into a low logic level. Subsequently, if the first clock signal C1 changes from a high logic level to a low logic level again, then the fifth NMOS transistor T5 remains a turned-on state, so that a voltage $V_{out}$ at the output line $4_i$ changes to a low logic level. Next, if the third clock signal C3 changes from a low logic level to a high logic level again, the third NMOS transistor T3 is turned on, thereby allowing a supply voltage $V_{cc}$ to be charged onto the second node P2. Thus, a high logic level voltage VP2 appears at the second node P2. At this time, the sixth NMOS transistor TG receiving a high logic voltage VP2 of the second node P2 at its gate terminal is turned on to discharge a voltage $V_{out}$ at the output line $4_i$ to a ground voltage level $V_{ss}$. Accordingly, a output voltage $V_{out}$ at the output line $4_i$ has a low logic level. Likewise, the second NMOS transistor T2 receiving a high logic level voltage VP2 at its gate terminal also is turned on to discharge a charge voltage VP1 at the first node P1 onto the ground voltage level $V_{ss}$. As a result, a charge voltage VP1 at the first node P1 has a low logic level. As described above, the conventional shift register sequentially shifts the start pulse SP from the first output line $4_1$ to the $n^{th}$ output line $4_n$ using the clock signals C1 to C3, thereby sequentially driving the output lines $4_1$ to $4_n$.

However, the conventional shift register needs four pulse signals including three clock signals C1 to C3 and a start pulse SP and, at the same time, requires a circuitry for generating the clock signals and the pulse signals. This causes a complication in the structure of the external control circuit, as well as an increase in the manufacturing cost.

SUMMARY OF THE INVENTION

Accordingly, it is an object of the present invention to provide a shift register that is suitable for reducing the required number of clock signals and for simplifying an external control circuit.

In order to achieve these and other objects of the invention, each stage in the shift register according to one aspect of the present invention includes an output circuit for responding to a first control signal to apply any one of the first and second clock signals to the row line of the liquid crystal cell array and thus to charge the row line, and for responding to a second control signal to discharge a voltage at the row line; and an input circuit for responding to a clock signal different from any one of an output signal of the previous stage and the start pulse to generate the first control signal, and for responding to a clock signal different from the first control signal to generate the second control signal.

A shift register according to another aspect of the present invention includes odd-numbered stages each having an output circuit for responding to a first control signal to apply the first clock signal to the odd-numbered row line of the liquid crystal cell array and for responding to a second a-control signal to discharge a voltage at the odd-numbered row line of the liquid crystal cell array; and an input circuit for responding to any one of an output signal of the previous stage and the start pulse and the second clock signal to generate the first and second control signals, and even-numbered stages each having an output circuitry for responding to a third control signal to apply the second clock signal to the even-numbered row line of the liquid crystal cell array and for responding to a fourth control signal to discharge a voltage at the even-numbered row line of the liquid crystal cell array; and an input circuit for responding to an output signal of the previous stage and the first clock signal to generate the third and fourth control signals.

A shift register according to still another aspect of the present invention includes (3k)th stages (wherein K is an integer), each having a first output circuit for responding to a first control signal to apply the first clock signal to the $(3k)^{th}$ row line of the liquid crystal cell array and for responding to a second control signal to discharge a voltage at the $(3k)^{th}$ row line of the liquid crystal cell array; and a first input circuit for responding to any one of the start pulse and an output signal of the previous stage and the third clock signal to generate the first and second control signals, $(3k+1)^{th}$ stages each having a second output circuit for responding to a third control signal to apply the second clock signal to the $(3k+1)^{th}$ row line of the liquid crystal cell array and for responding to a fourth control signal to discharge a voltage at the $(3k+1)^{th}$ row line of the liquid crystal cell array; and a second input circuit for responding to the output signal of the previous stage and the first clock signal to generate the third and fourth control signals, and $(3k+2)^{th}$ stages each having a third output circuit for responding to a fifth control signal to apply the third clock signal to the $(3k+2)^{th}$ row line of the liquid crystal cell array, and for responding to a sixth control signal to discharge a voltage at the $(3k+2)^{th}$ row line of the liquid crystal cell array; and a third input circuit for responding to the output signal of the previous stage and the second clock signal to generate the fifth and sixth control signals.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Figure 1:
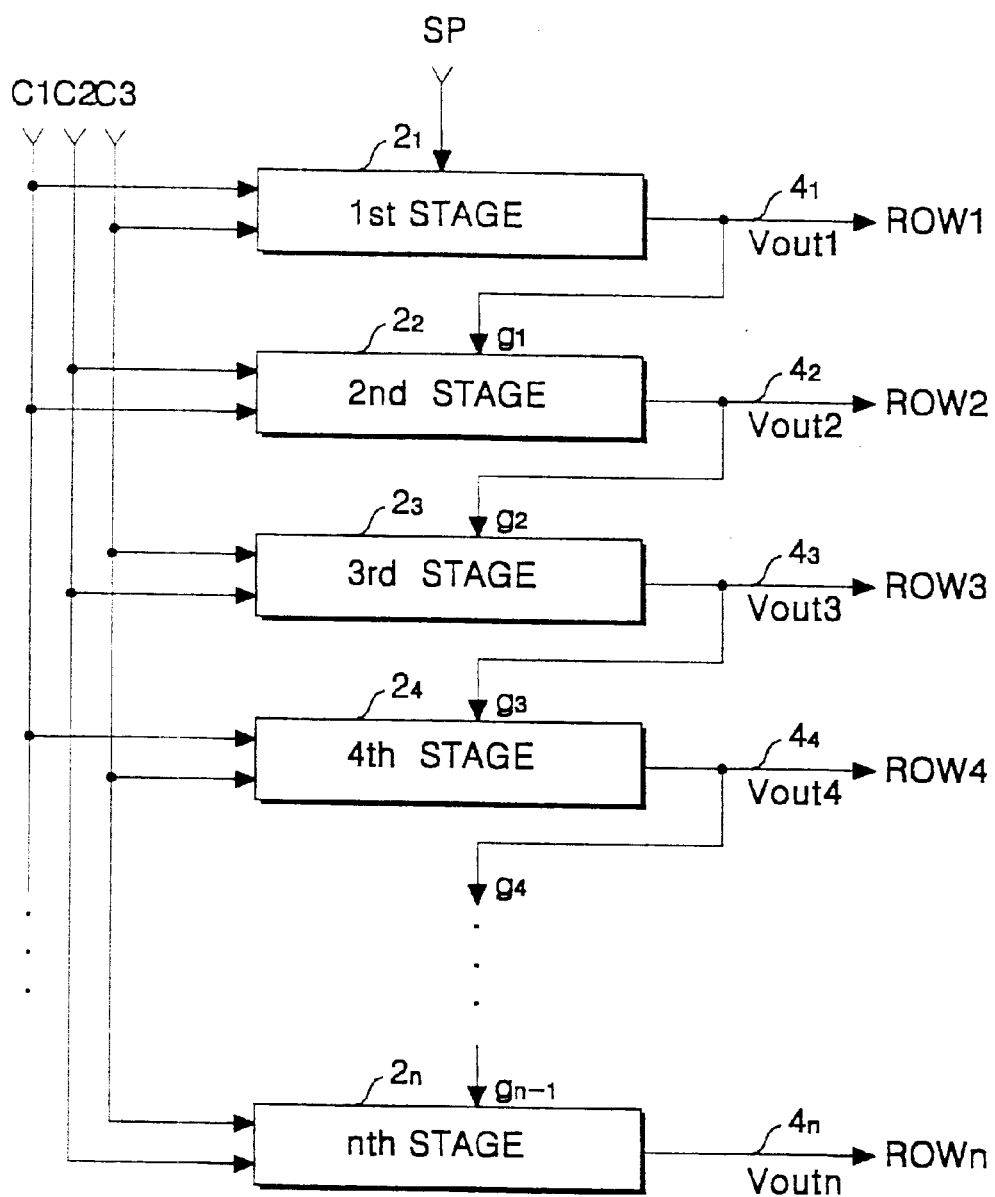
FIG. 1 is a schematic block diagram showing the configuration of a conventional shift register.
Figure 2:
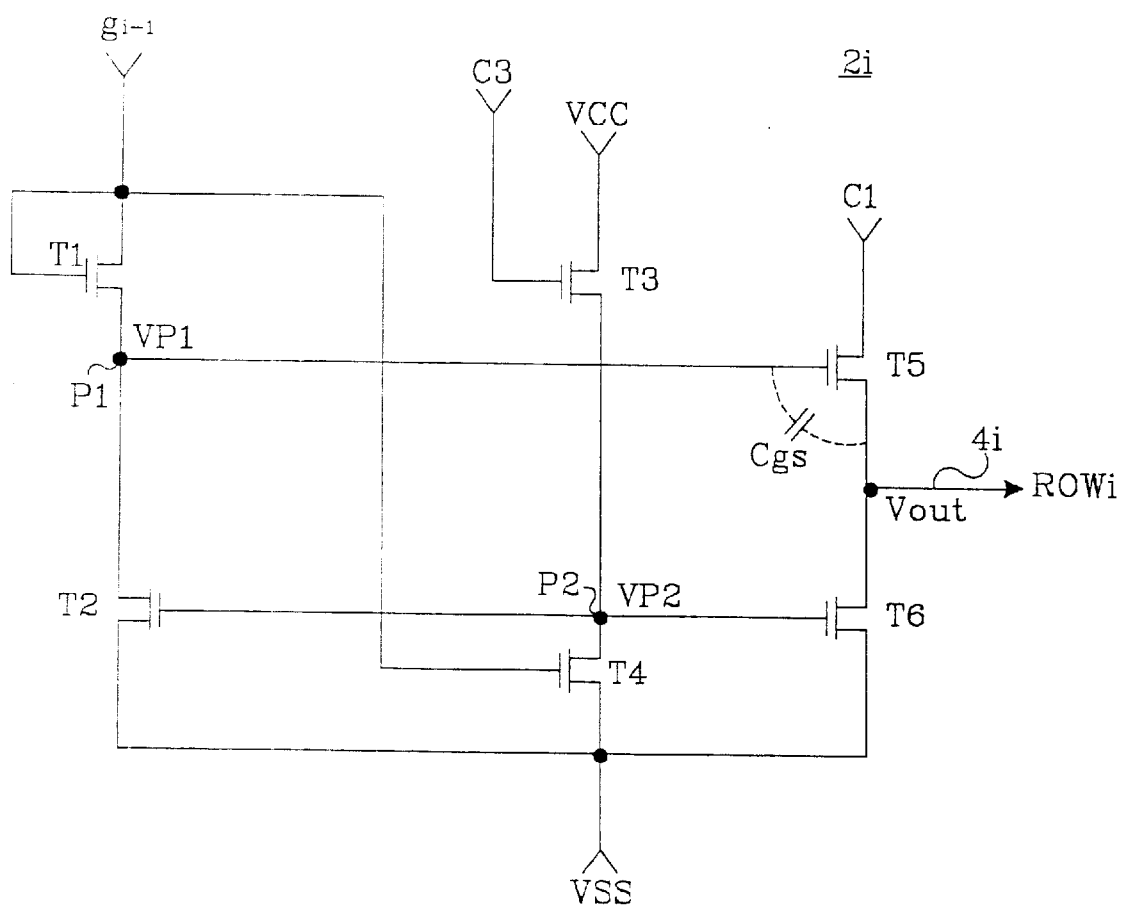
FIG. 2 is a detailed circuit diagram of a shift register stage shown in FIG. 1.
Figure 3:
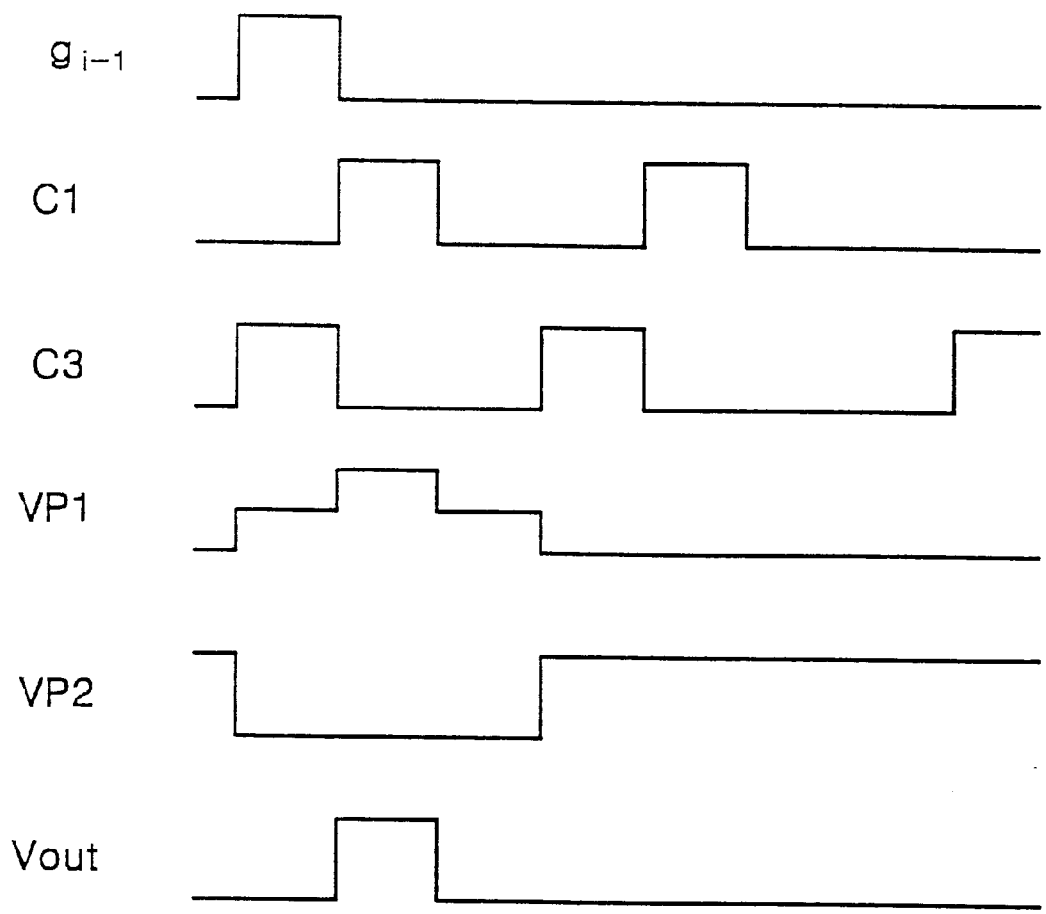
FIG. 3 is waveform diagram of input/output signals of the stage shown in FIG. 2.
Figure 4:
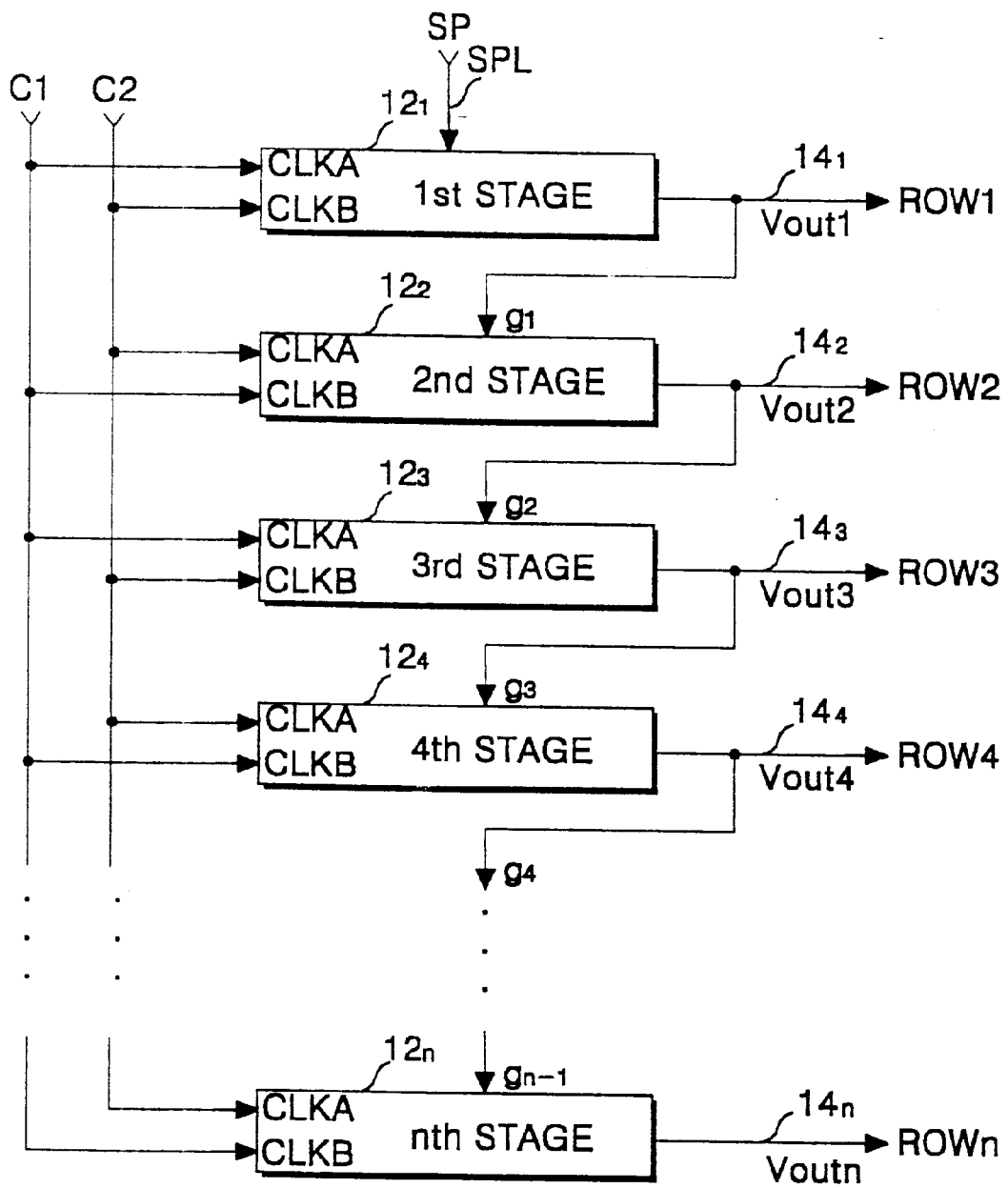
FIG. 4 is a schematic block diagram showing the configuration of a shift register according to a first embodiment of the present invention.

Referring to FIG. 4, there is shown a shift register according to a first embodiment of the present invention. The shift register includes n stages $12_1$ to $12_n$ connected, in cascade, to a start pulse input line SPL to drive an m×n pixel array. Output lines $14_1$ to $14_n$ of the n stages $12_1$ to $12_n$ are connected to n row lines $ROW_1$ to $ROW_n$ included in the pixel array, respectively. The first stage $12_1$ receives a start pulse SP from the start pulse input line SPL, and the $2^{nd}$ to $n^{th}$ stages $12_2$ to $12_n$ receive output signals $g_1$ to $g_{n-1}$ of the first to (n-1)th stages $12_1$ to $12_{n-1}$, respectively, as a start pulse. Each stage $12_1$ to $12_n$ includes first and second clock terminals CLKA and CLKB for inputting two clock signals C1 and C2, respectively. The first clock signal C1 is applied to the first clock terminal CLKA of odd-numbered stages $12_1, 12_3, \ldots, 12_{n-1}$, while a second clock signal C2 is applied to the second clock terminal CLKB thereof. On the other hand, the second clock signal C2 is applied to the first clock terminal CLKA of even-numbered stages $12_2, 12_4, \ldots, 12_n$, while the first clock signal C1 is applied to the second clock terminal CLKB thereof. The first clock signal C1 has an inverted waveform with respect to the second clock signal C2, as shown in FIG. 5.

Figure 5:
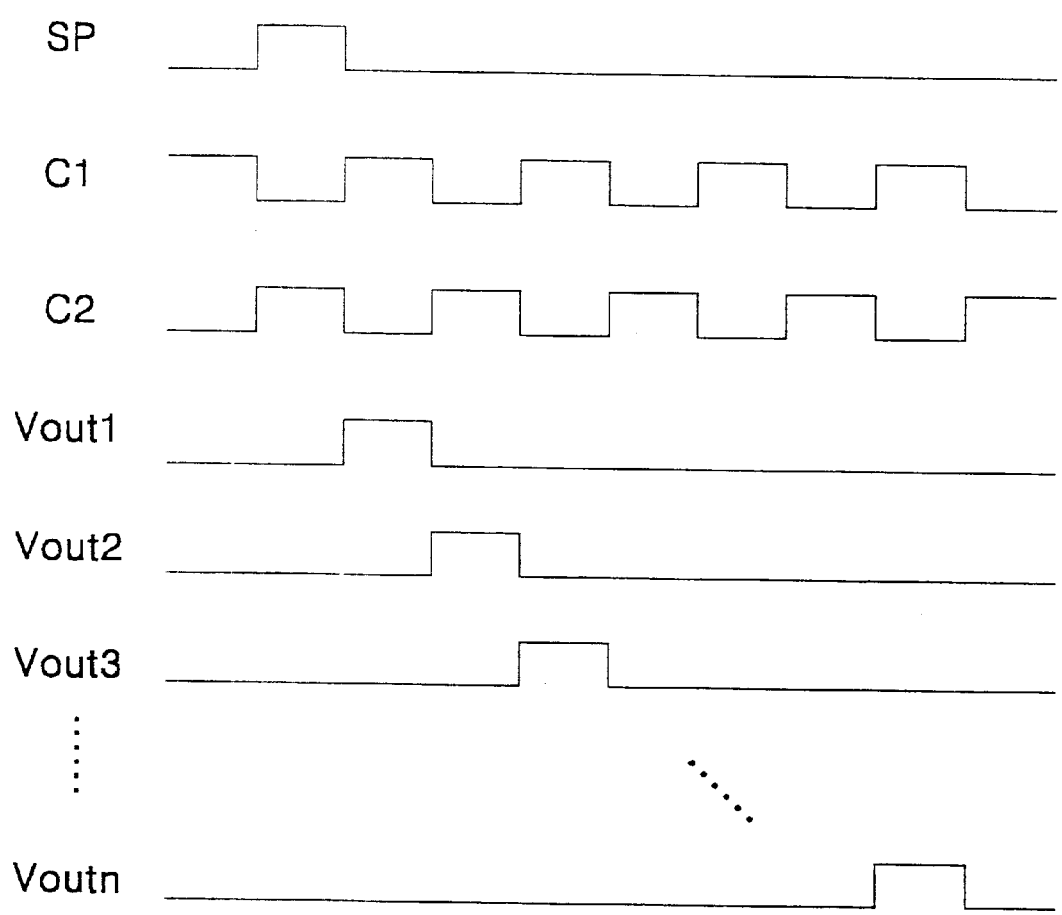
FIG. 5 is waveform diagrams of an input/output signal of the shift register shown in FIG. 4.

The $1^{st}$ to $n^{th}$ stages $12_1$ to $12_n$ respond to the first and second clock signals C1 and C2 to sequentially shift the start pulse SP at the start pulse input line SPL from the first output line $14_1$ to the $n^{th}$ output line $14_1$, thereby allowing n output voltage signals $Vout_1$ to $Vout_n$, as shown in FIG. 5, having a pulse enabled to a high logic level sequentially to emerge on the first to $n^{th}$ output lines $14_1$ to $14_n$, respectively.

Accordingly, pixels included in the pixel array are driven sequentially for each line. These input signals of the shift register, that is, the start pulse SP, the first and second clock signals C1 and C2 having an inverted phase with respect to each other, the supply voltage VCC, and the ground voltage VSS, are supplied from an external control circuit (not shown).

Figure 6:
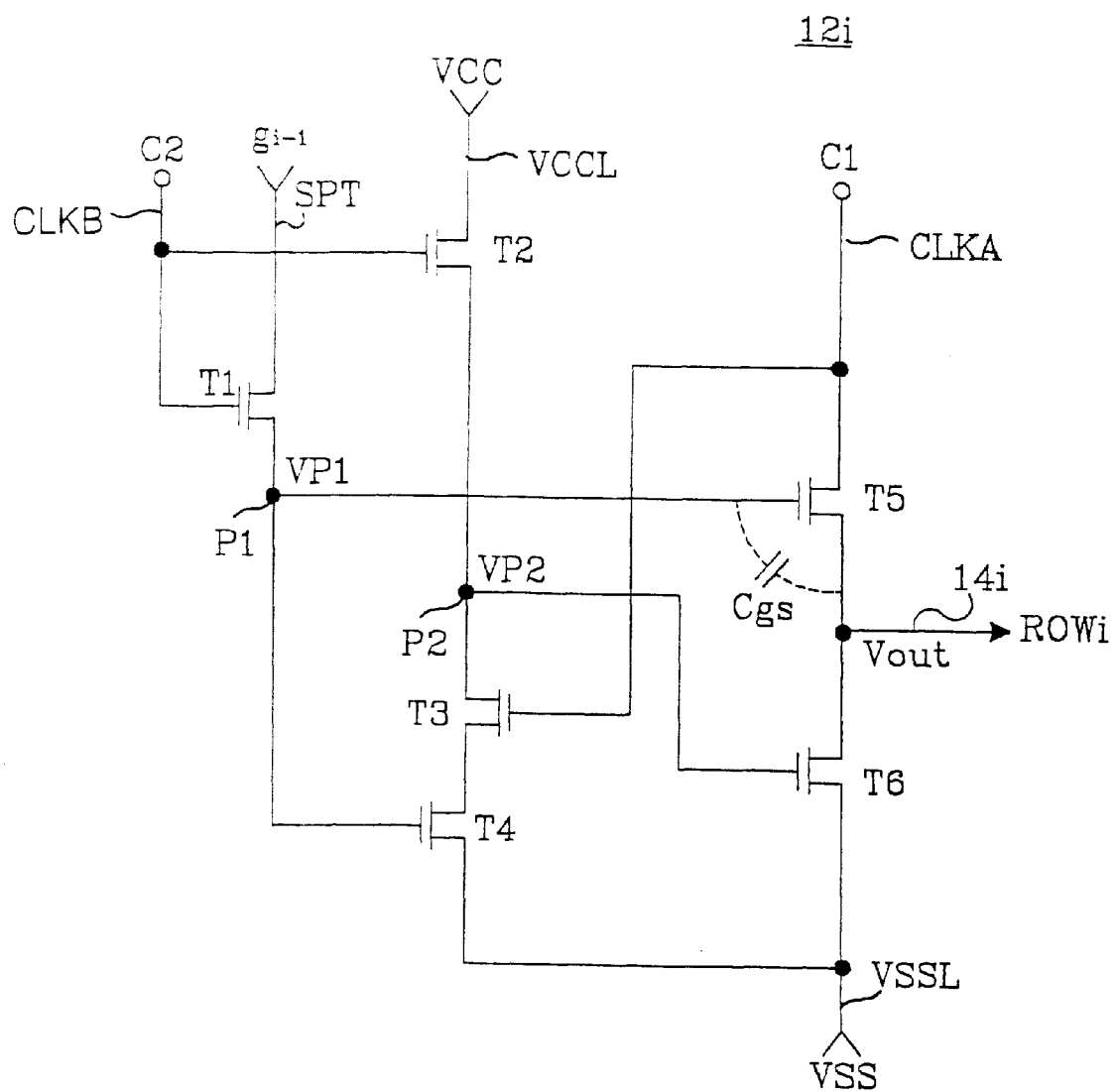
FIG. 6 is a detailed circuit diagram of an embodiment of the stage shown in FIG. 4.

Preferably, as shown in FIG. 6, each stage $12_1$ to $12_n$ further includes a start pulse input terminal SPT, a first NMOS transistor T1 connected between a second clock terminal CLKB and a first node P1, a second NMOS transistor connected among a supply voltage line VCCL, the second clock terminal CLKB and a second node P2, third and fourth NMOS transistors T3 and T4 connected, in series, between a ground voltage line VSSL and the second node P2, a fifth NMOS transistor T5 connected among the first clock terminal CLKA, the first node P1 and the output line $14_i$, and a sixth NMOS transistor T6 connected among the ground voltage line VSSL, the second node P2 and the output line $14_i$.

Figure 7:
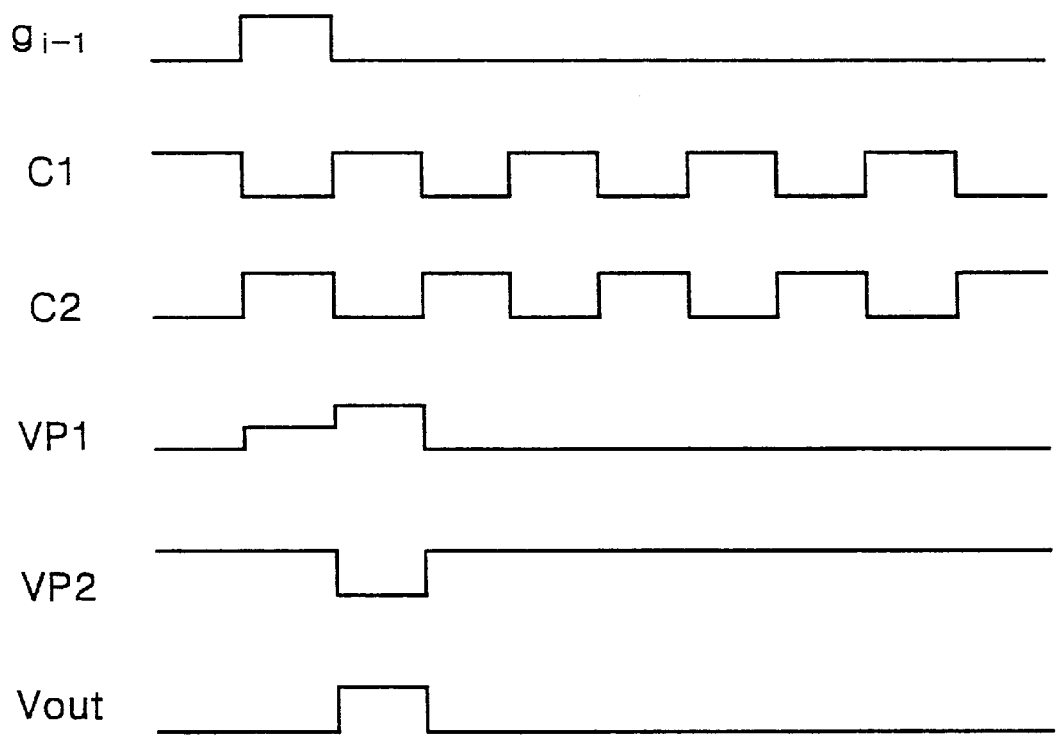
FIG. 7 is waveform diagrams of an input/output signal of the stage shown in FIG. 6.

Prior to an explanation as to an operation of the circuit shown in FIG. 6, it is assumed that a stage of FIG. 6 should be the $i^{th}$ stage $12_I$, and i should be an odd number. In this case, the first clock terminal CLKA receives the first clock signal C1 while the second clock terminal CLKB receives the second clock signal C2. As shown in FIG. 7, an output signal $g_{i-1}$ of the previous stage $12_{i-1}$ is changed from a low logic level to a high logic level simultaneously with the second clock signal C2. On the other hand, the first clock signal C1 applied to the first clock terminal CLKA is changed from a high logic level to a low logic level. At this time, the first NMOS transistor T1 is turned on to charge the output signal $g_{i-1}$ of the previous stage $12_i$ onto the first node P1. The fourth NMOS transistor T4 is turned on by a charge voltage VP1 charged in the first node P1 to thereby connect the third NMOS transistor T3 to the ground voltage line VSSL. The fifth NMOS transistor T5 also is turned on by the charge voltage charged in the first node P1 to thereby connect the first clock terminal CLKA to the output line $14_i$. Furthermore, the second NMOS transistor T2 also is turned on by the second clock signal C2 to thereby deliver a supply voltage VCC on the supply voltage line VCCL onto the second node P2. On the other hand, the third NMOS transistor T3 is turned off by the low logic level of first clock signal C1 from the first clock terminal CLKA. Accordingly, the second node P2 charges to the supply voltage VCC from the supply voltage line VCCL and the sixth NMOS transistor T6 is turned on by a charge voltage on the second node P2, thereby connecting the output line $14_i$ to the ground voltage line VSSL. The fifth and sixth NMOS transistors T5 and T6 are turned on in this manner and the first clock signal C1 has a low logic level, so that a low logic level output voltage $V_{out}$ emerges at the output line $14_i$.

Subsequently, the second clock signal C2 and the output signal $g_{i-1}$ of the previous stage $12_{i-1}$ transition from a high logic level to a low logic level, whereas the first clock signal C1 changes from a low logic level to a high logic level. The first and second transistors T4 and T5 are turned off by the low logic level of second clock signal C2. On the other hand, the third NMOS transistor T3 is turned on by the high logic level of the first clock signal C1 to thereby discharge the charge voltage VP2 on the second node P2 onto the ground voltage line VSSL, via the drain and source terminals thereof and the drain and source terminals of the fourth NMOS transistor T4. Thus, a voltage at the second node P2 has the ground voltage VSS. The sixth NMOS transistor T6 is turned off by a charge voltage VP2 with a ground voltage VSS from the second node P2, thereby opening or disconnecting the output line $14_i$ from the ground voltage line VSSL. As a result, the output line $14_i$ charges to the high logic level voltage of the first clock signal C1 input from the first clock terminal CLKA via the fifth NMOS transistor T5, thereby generating a high logic level output voltage Vout as shown in FIG. 7. At this time, the charge voltage VP1 at the first node P1 is coupled with the output line $14_i$ by a parasitic capacitor $C_{gs}$ existing between the gate terminal and the source terminal of the fifth NMOS transistor T5, thereby allowing the first node P1 to be raised by a voltage $V_{out}$ on the output line $14_i$ as shown in FIG. 7. Thus, the high logic level of the first clock signal C1 is applied to the output line $14_i$ with no attenuation. The $i^{th}$ row line ROWi of the pixel array is enabled by such a high logic level output voltage, Vout.

Consequently, the first clock signal C1 transitions from a high logic level to a low logic level, whereas the second clock signal C2 changes from a low logic level to a high logic level. The first NMOS transistor T1 is turned on to discharge the charge voltage VP1 charged in the first node P1 onto the start pulse input terminal SPT. Thus, a charge voltage VP1 at the first node P1 has the ground voltage VSS. Accordingly, the fourth NMOS transistor T4 is turned off to open or disconnect the third NMOS transistor T3 from the ground voltage line VSSL. The fifth NMOS transistor T5 also is turned off by the ground voltage VSS on the first node P1 to thereby open or disconnect a current path between the first clock terminal CLKA and the output line $14_i$. Meanwhile, the second NMOS transistor T2 turned on by the high logic level of the second clock signal C2 delivers the supply voltage VCC on the supply voltage line VCCL onto the second node P2. At this time, since the fourth NMOS transistor T4 has been turned off, the second node P2 charges the supply voltage VCC input, from the supply voltage line VSSL via the second NMOS transistor T2. Thus, a high logic level charge voltage VP2 emerges at the second node P2. The sixth NMOS transistor T6 is turned on by the high logic level charge voltage VP2 on the second node P2 to thereby connect the output line $14_i$ to the ground voltage line VSSL. As a result, the output voltage Vout at the output line $14_i$ has a low logic level.

Figure 8:
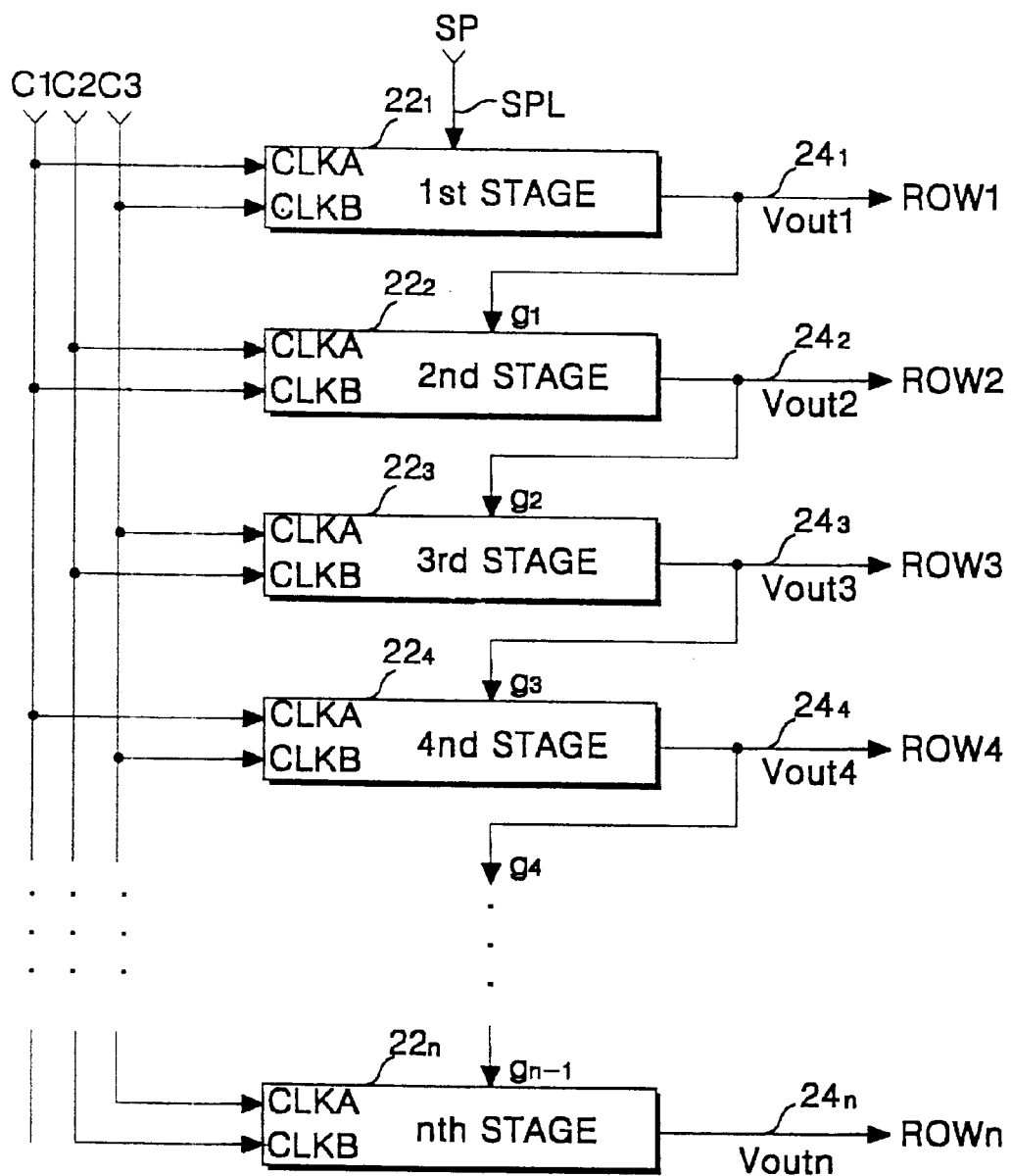
FIG. 8 is a schematic block diagram showing the configuration of a shift register according to a second embodiment of the present invention.

Referring now to FIG. 8, there is shown a shift register according to a second embodiment of the present invention. The shift register includes n stages $22_1$ to $22_n$ connected, in cascade, to a start pulse input line SPL. Output lines $24_1$ to $24_n$ of the n stages are connected to n row lines $ROW_1$ to $ROW_n$ included in a pixel array, respectively. A start pulse SP at a start pulse input line SPL is applied to the first stage $22_1$, whereas output signals $g_1$ to $g_{n-1}$ of the first to $(n-1)^{th}$ stages $22_1$ to $22_{n-1}$ are applied to the post stages $22_2$ to $22_n$, respectively, as a start pulse.

Figure 9:
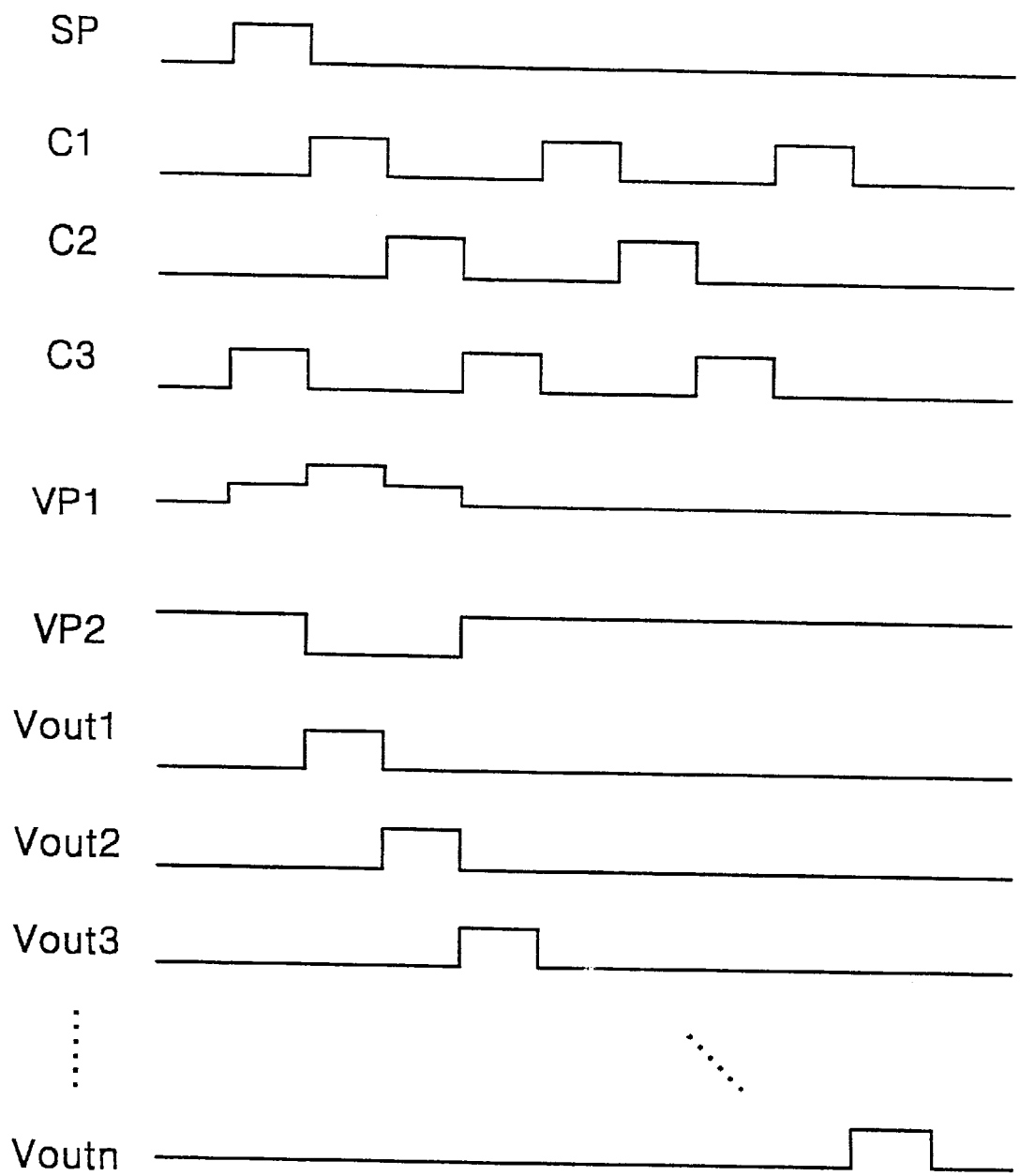
FIG. 9 is waveform diagrams of an input/output signal of the shift register shown in FIG. 8.

Each stage $22_1$ to $22_n$ includes first and second clock terminals CLKA and CLKB for inputting two clock signals of the first to third clock signals C1 to C3, phase-delayed sequentially as shown in FIG. 9. The first clock signal C1 is applied to the first clock terminal CLKA of the $(3k+1)^{th}$ stages (wherein K is an integer) $22_1$, $22_4$, . . . while the third clock signal C3 is applied to the second clock terminal CLKB thereof. The second clock signal C2 is applied to the first clock terminal CLKA of the $(3k+2)^{th}$ stages (wherein K is an integer) $22_2$, $22_5$, . . . while the first clock signal C1 is applied to the second clock terminal CLKB thereof. The third clock signal C3 is applied to the first clock terminal CLKA of the $(3k)^{th}$ stages (wherein K is an integer) $22_3$, $22_6$, . . . while the second clock signal C2 is applied to the second clock terminal CLKB thereof.

The $1^{st}$ to $n^{th}$ stages $22_1$ to $22_n$ respond to any two clock signal of the first to third clock signals C1 to C3 to sequentially shift the start pulse SP at the start pulse input line SPL from the first output line $24_1$ to the $n^{th}$ output line $24_n$. Accordingly, n output voltage signals $Vout_1$ to $Vout_n$, as shown in FIG. 9, having a pulse enabled to a high logic level, sequentially emerge on the $1^{st}$ to $n^{th}$ output lines $24_1$ to $24_n$ of the $1^{st}$ to $n^{th}$ stages $22_1$ to $22_n$, respectively. As a result, the $1^{st}$ to $n^{th}$ low lines $ROW_1$ to $ROW_n$ of pixels included in the pixel array are sequentially enabled by the output signals of the $1^{st}$ to $n^{th}$ stages $22_1$ to $22_n$.

Preferably, such $1^{st}$ to $n^{th}$ stages $22_1$ to $22_n$ are implemented similarly to the stage circuit of FIG. 6 described earlier. It is assumed that a stage of FIG. 6 should be the $i^{th}$ stage $22_i$ and i should be 3k+1 (wherein k is an integer). In this case, the first clock terminal CLYA receives the first clock signal C1, while the second clock terminal CLKB receives the third clock signal C3. As shown in FIG. 9, an output signal $g_{i-1}$ of the previous stage $22_{i-1}$ is changed from a low logic level to a high logic level simultaneously with the third clock signal C3. On the other hand, the first clock signal C1, applied to the first clock terminal CLKA, remains at a low logic level. At this time, the first NMOS transistor T1 is turned on to transfer the level of the output signal $g_{i-1}$ of the previous stage $22_{i-1}$ (FIG. 8) onto the first node P1. The fourth NMOS transistor T4 is turned on by a charge voltage VP1 charged in the first node P1 to thereby connect the third NMOS transistor T3 to the ground voltage line VSSL. The fifth NMOS transistor T5 also is turned on by the charge voltage VP1 charged in the first node P1 to thereby connect the first clock terminal CLKA to the output line $24_i$.

Furthermore, the second NMOS transistor T2 also is turned on by the high logic level of the third clock signal C3 from the second clock terminal CLKB to thereby deliver a supply voltage VCC on the supply voltage line VCCL into the second node P2. On the other hand, the third NMOS transistor T3 is turned off by the low logic level of the first clock signal C1 from the first clock terminal CLKA. Accordingly, the second node P2 charges to the supply voltage VCC from the supply voltage line VCCL and the sixth NMOS transistor T6 is turned on by a voltage VP2 on the second node P2, thereby connecting the output line $24_i$ (FIG. 8) or $14_i$ (FIG. 6) to the ground voltage line VSSL. The fifth and sixth NMOS transistors T5 and T6 are turned on in this manner and the first clock signal C1 has a low logic level, so that a low logic level output voltage Vout emerges at the output line $24_i$ (FIG. 8) or $14_i$ (FIG. 6).

Subsequently, the third clock signal C3 and the output signal $g_{i-1}$ of the previous stage $22_{i-1}$ transition from a high logic level to a low logic level, whereas the first clock signal C1 changes from a low logic level to a high logic level. The first and second transistors T1 and T2 are turned off by the low logic level of the third clock signal C3. On the other hand, the third NMOS transistor T3 is turned on by a high logic level of the first clock signal C1 from the first clock terminal CLKA to thereby discharge the charge voltage VP2 out the second node P2, via the drain and source terminals thereof and the drain and source terminals of the fourth NMOS transistor T4, onto the ground voltage line VSSL. Thus, a voltage at the second node P2 has the ground voltage VSS. The sixth NMOS transistor T6 is turned off by the ground voltage VSS from the second node P2, thereby opening or disconnecting the output line $24_i$ from the ground voltage line VSSL. As a result, the output line $24_i$ charges to the high logic level of the first clock signal C1 input from the first clock terminal CLKA, via the fifth NMOS transistor T5, thereby generating a high logic level of output voltage Vout as shown in FIG. 9. At this time, the charge voltage VP1 at the first node P1 is coupled with the output line $24_i$ by a parasitic capacitor $C_{gs}$ existing between the gate terminal and the source terminal of the fifth NMOS transistor T5, thereby allowing the first node P1 to be raised by a voltage Vout on the output line $24_i$ as shown in FIG. 9. Thus, the high logic level of the first clock signal C1 is applied to the output line $24_i$ with no attenuation. The $i^{th}$ row line ROWi of the pixel array is enabled by such a high logic level output voltage Vout.

Next, if the first clock signal C1 transitions from a high logic level into a low logic level, then the third NMOS transistor T3 is turned off to open or disconnect the second node P2 from the fourth NMOS transistor T4. Also, the output voltage Vout on the output line $24_i$ is discharged, via the fifth NMOS transistor T5, onto the first clock line CLKA to thereby apply a low logic level of output signal Vout to the $i^{th}$ row line ROWi.

Finally, if the third clock signal C3 transitions from a low logic level to a high logic level, then the first NMOS transistor T1 is turned on to discharge the voltage VP1 charged onto the first node P1, into the start pulse input terminal SPT. Thus, a charge voltage VP1 at the first node P1 has the ground voltage VSS. Accordingly, the fourth NMOS transistor T4 is turned off to open or disconnect the third NMOS transistor T3 from the ground voltage line VSSL. The fifth NMOS transistor T5 also is turned off by the ground voltage VSS on the first node P1 to thereby open or disconnect a current path between the first clock terminal CLKA and the output line $24_i$. Meanwhile, the second NMOS transistor T2, turned on by the high logic level of third clock signal C3, delivers the supply voltage VCC on the supply voltage line VCCL onto the second node P2. At this time, since the third and fourth NMOS transistors T3 and T4 have been turned off, the second node P2 charges the supply voltage VCC input from the supply voltage line VSSL, via the second NMOS transistor T2. Thus, a high logic level of charge voltage VP2 emerges at the second node P2. The sixth NMOS transistor T6 is turned on by the high logic level of charge voltage VP2 on the second node P2 to thereby connect the output line $24_i$ to the ground voltage line VSSL. As a result, the output voltage Vout at the output line $24_i$ has a low logic level.

As described above, the shift register is driven by three-phase clock signals C1 to C3 to enlarge an interval between the clock signals.

Accordingly, the shift register operates stably, even though a clock delay or an overlap occurs. Also, since a voltage on the output line $24_i$ is charged or discharged through the fifth NMOS transistor T5, the shift register can dramatically reduce the channel width of the sixth NMOS transistor T6.

Figure 10:
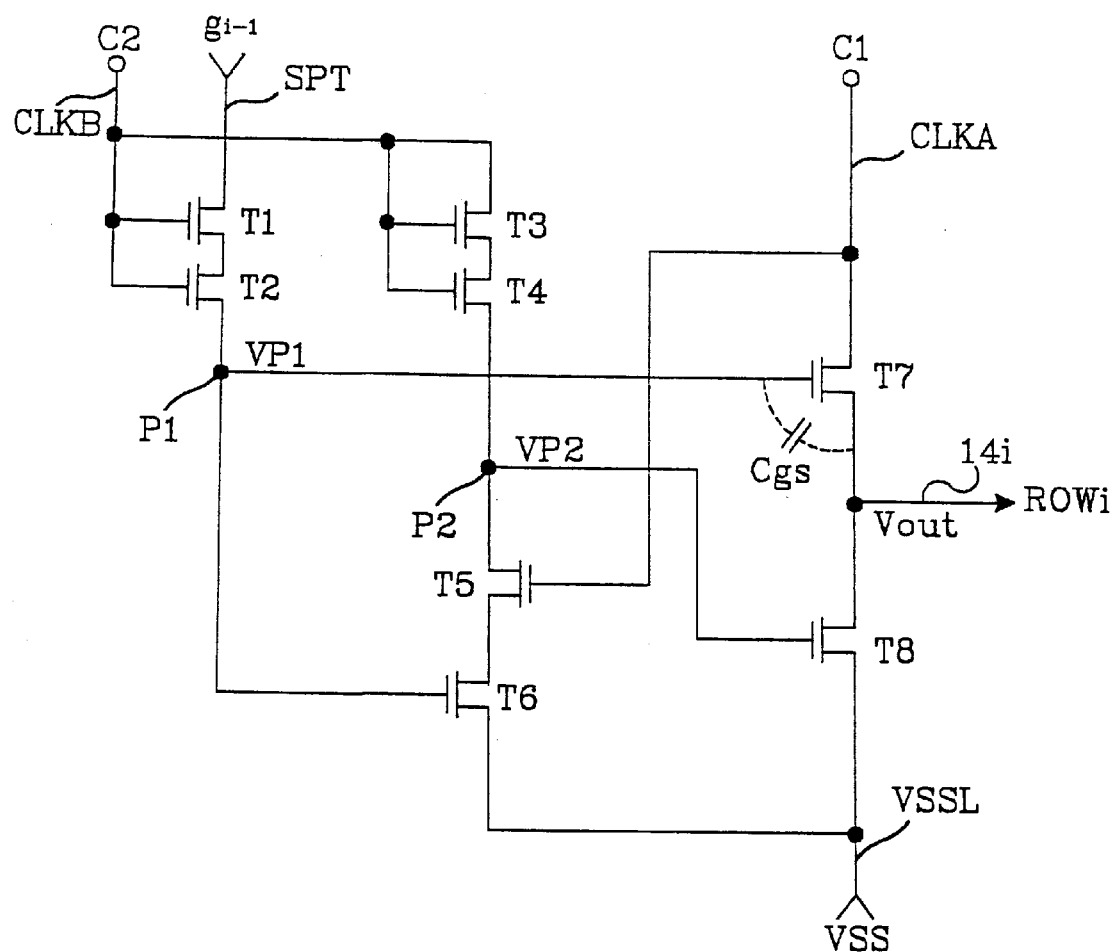
FIG. 10 is a detailed circuit diagram of another embodiment of the stage shown in FIG. 4.

Referring now to FIG. 10, there is shown another embodiment of the stage shown in FIG. 4. For the sake of convenience, it is assumed that the stage of FIG. 10 is the $i^{th}$ stage $12_i$ wherein i is an odd integer. In FIG. 10, the stage $12_i$ includes first and second NMOS transistors T1 and T2 connected, in series, between a start pulse input terminal SPT and a first node P1, third and fourth NMOS transistors T3 and T4 connected, in series, between a second clock terminal CLKB and a second node P2, fifth and sixth NMOS transistors T5 and T6 connected, in series, between a ground voltage line VSSL and the second node P2, a seventh NMOS transistor T7 connected between the first node P1 and the output line $14_i$, and an eighth NMOS transistor T8 connected between the second node P2, the ground voltage line VSSL, and the output line $14_i$. All the gates of the first to fourth NMOS transistors T1 to T4 are connected to the second clock terminal CLKB. In the stage of FIG. 10 configured in this manner, a supply voltage line VCCL having been included in the stage shown in FIG. 6 is removed. Also, the first and second NMOS transistors T1 and T2 minimize a leakage current from the first node P1 into the start pulse input terminal SPT when a current path between the first node P1 and the start pulse input terminal SPT is disconnected. The third and fourth NMOS transistors T3 and T4 minimize a leakage current from the second node P2 into the second clock terminal CLKB when a current path between the second node P2 and the second clock terminal CLKB is disconnected. The stage of FIG. 10 has a wide operation region in accordance with the minimization of leakage current.

The odd-numbered stage $12_i$ of FIG. 10 is operated as represented in the waveform diagrams of FIG. 7. As shown in FIG. 7, the output signal $g_{i-1}$ of the previous stage $12_{i-1}$ and the second clock signal C2 change from a low logic level to a high logic level. On the other hand, the first clock signal C1 applied to the first clock terminal CLKA changes from a high logic level to a low logic level. At this time, the first and second NMOS transistors T1 and T2 are turned on such that the output signal $g_{i-1}$ of the previous stage $12_i$ is charged onto the first node P1. The sixth NMOS transistor T6 is turned on by a charge voltage VP1 charged onto the first node P1 to connect the fifth NMOS transistor T5 to the ground voltage line VSSL. The seventh NMOS transistor T7 also connects the first clock terminal CLKA to the output line $14_i$ by the voltage VP1 charged onto the first node P1. On the other hand, the fifth NMOS transistor T5 is turned off by the low logic level first clock signal C1 from the first clock terminal CLKA. Thus, a high logic level second clock signal C2 at the second clock terminal CLKB is charged, via the third and fourth NMOS transistors T3 and T4 acting as a diode series circuit, onto the second node P2. The eighth NMOS transistor T8 is turned on by a charge voltage VP2 at the second node P2, so that the output line $14_i$ is connected to the ground voltage line VSSL. Since the seventh and eighth NMOS transistors are turned on in this manner and the first clock signal C1 has a low logic level, a low logic level output voltage Vout emerges at the output line $142_i$.

Subsequently, the second clock signal C2 and the output signal $g_{i-1}$ of the previous stage $12_{i-1}$ transition from a high logic level to a low logic level, whereas the first clock signal C1 changes from a low logic level to a high logic level. The first to fourth transistors T1 to T4 are turned off by the low logic level of second clock signal C2. On the other hand, the fifth NMOS transistor T5 is turned on by the high logic level first clock signal C1 from the first clock terminal CLKA to thereby discharge the charge voltage VP2 on the second node P2, via the drain and source terminals thereof and the drain and source terminals of the sixth NMOS transistor T6, onto the ground voltage line VSSL. Thus, the voltage at the second node P2 has the ground voltage VSS. The eighth NMOS transistor T8 is turned off by the ground voltage VSS from the second node P2, thereby opening or disconnecting the output line $14_i$ from the ground voltage line VSSL. As a result, the output line $14_i$ charges to the high logic of first clock signal C1 input form the first clock terminal CLKA, via the seventh NMOS transistor T7, thereby generating a high logic level output voltage Vout as shown in FIG. 7. At this time, the charge voltage VP1 at the first node P1 is coupled with the output line $14_i$ by way of a parasitic capacitor $C_{gs}$ existing between the gate terminal and the source terminal of the seventh NMOS transistor T7, thereby allowing the first node P1 to be raised by a voltage Vout on the output line $14_i$ as shown in FIG. 7. Thus, the high logic level of the first clock signal C1 is applied to the $14_i$ with no attenuation. The $i^{th}$ row line ROWi of the pixel array is enabled by such a high logic level of output voltage Vout.

Consequently, the first clock signal C1 transitions from a high logic level to a low logic level, whereas the second clock signal C2 changes from a low logic level to a high logic level. The first and second NMOS transistors T1 and T2 are turned on to discharge the charge voltage VP1 charged in the first node P1 onto the start pulse input terminal SPT. Thus, the charge voltage VP1 at the first node P1 has the ground voltage VSS. Accordingly, the sixth NMOS transistor T6 is turned off to open or disconnect the fifth NMOS transistor T5 from the ground voltage line VSSL. The seventh NMOS transistor T7 also is turned off by the ground voltage VSS on the first node P1 to thereby open or disconnect a current path between the first clock terminal CLKA and the output line $14_i$.

Also, the fifth NMOS transistor T5 also is turned off by the low logic level first clock signal C1. As the fifth and sixth NMOS transistors T5 and T6 are turned off, the high logic level of second clock signal C2 at the second clock terminal CLKB is charged, via the third and fourth NMOS transistors T3 and T4 serving as a diode series circuit, onto the second node P2.

Thus, a high logic level of charge voltage VP2 emerges at the second node P2. The eighth NMOS transistor T8 is turned on by the charge voltage VP2 at the second node P2 to connect the output line $14_i$ to the ground voltage line VSSL. As a result, the output voltage Vout at the output line $14_i$ is discharged onto the ground voltage line VSSL to a low logic level. The stage $12_i$ of FIG. 10 may be used as a stage in the shift register of FIG. 8, requiring a three-phase clock.

As described above, the shift register according to the present invention may be driven with a two-phase clock signal, so that it can reduce the required number of clock supply lines and hence reduce the number of circuits. In other words, the shift register according to the present invention can simplify the configuration of an external control circuit. Furthermore, the shift register according to the present invention may be operated by a three-phase clock signal, so that it can enlarge an interval between clock signals and can drive the pixel array stably even when a delay or an overlap in the clock signals occurs.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

Accordingly, the scope of the invention shall be determined only by the appended claims and their equivalents.

What is claimed is:

1. A shift register for driving row lines of a liquid crystal cell array, said shift register including a plurality of stages connected to a generator for generating a high level supply voltage, a low level supply voltage, and first and second clock signals, said plurality of stages being connected respectively to the row lines of the liquid crystal cell array and connected, in series, to a start signal input line for inputting a start signal, wherein each of said stages comprises:

an output circuitry for responding to a first control signal to apply one of the first and second clock signals to a corresponding one of the row lines of the liquid crystal cell array to charge the one row line, and for responding to a second control signal to discharge a voltage on the one row line; and an input circuitry for responding to one of the first and second clock signals different from any one of an output signal of a previous stage and the start signal to generate the first control signal, and for responding to the other one of the first and second clock signals different from to generate the second control signal.

2. The shift register as claimed in claim 1, wherein said first and second clock signals have an opposite phase with respect to each other.

3. The shift register as claimed in claim 1, wherein said start signal is applied to the first stage in synchronization with one of the first and second clock signals.

4. The shift register as claimed in claim 1, wherein said output circuitry comprises:

a pull-up transistor having an input electrode supplied with one of the first and second clock signals, an output electrode connected to the row line of the liquid crystal cell array and a control electrode supplied with the first control signal; and a pull-down transistor having an input electrode coupled with the low level supply voltage, an output electrode connected to the row line and a control electrode supplied with the second control signal.

5. The shift register as claimed in claim 1, wherein said input circuitry comprises:

a first transistor having a control electrode supplied with the one of the first and second clock signals, an input electrode supplied with the start signal and an output electrode connected to a first control signal input terminal of the output circuitry; and a second transistor having a control electrode supplied with the other of the first and second clock signals, an input electrode coupled with the high level supply voltage and an output electrode connected to a second control signal input terminal of the output circuitry.

6. The shift register as claimed in claim 1, further comprising:

a reset circuit for initializing the second control signal in a time interval when one of the first and second clock signals is applied to the row line of the liquid crystal cell array.

7. The shift register as claimed in claim 6, wherein said reset circuit comprises:

a first transistor having a control electrode supplied with one of the first and second clock signals, an input electrode supplied with the second control signal and an output electrode; and a second transistor having a control electrode supplied with the first control signal, an input electrode connected to the output electrode of the first transistor and an output electrode connected to the generator for generating the low level supply voltage.

8. A shift register for driving row lines of a liquid crystal cell array, said shift register including a plurality of stages connected commonly to a generator for generating a low level supply voltage and first and second clock signals, said plurality of stages being connected to the row lines of the liquid crystal cell array and connected, in series, to a start signal input line for inputting a start pulse, wherein each odd-numbered stage of said plurality of stages comprises:
an output circuitry for responding to a first control signal to apply the first clock signal to an odd-numbered row line of the liquid crystal cell array and for responding to a second control signal to discharge a voltage at the odd-numbered row line of the liquid crystal cell array; and
an input circuitry for responding to an output signal of a previous stage and the start pulse and the second clock signal to generate the first and second control signals, and wherein each even-numbered stage of the plurality of stages comprises:
an output circuitry for responding to a third control signal to apply the second clock signal to an even-numbered row line of the liquid crystal cell array and for responding to a fourth control signal to discharge a voltage at the even-numbered row line of the liquid crystal cell array; and
an input circuitry for responding to an output signal of the previous stage and the first clock signal to generate the third and fourth control signals.

9. The shift register as claimed in claim 8, wherein said first clock signal has an opposite phase with respect to the second clock signal.

10. The shift register as claimed in claim 8, wherein said start signal is applied to the first stage in synchronization with the second clock signal.

11. The shift register as claimed in claim 8, wherein each of the odd-numbered stages further comprises a first reset circuit for initializing the second control signal in a time interval when the first clock signal is applied to the row line of the liquid crystal cell array, and wherein each of the even-numbered stages further comprises a second reset circuit for initializing the fourth control signal in a time interval when the second clock signal is applied to the row line of the liquid crystal cell array.

12. The shift register as claimed in claim 8, wherein said input circuitry included in the odd-numbered stage comprises:
a first transistor having a control electrode supplied with the second clock signal, an input electrode supplied with one of the start pulse and an output signal of the previous stage and an output electrode for outputting the first control signal; and
a second transistor having a control electrode and an input electrode supplied commonly with the first clock signal and an output electrode for outputting the second control signal, and wherein said input circuitry included in the even-numbered stage comprises:

a third transistor having a control electrode supplied with the first clock signal, an input electrode supplied with the output signal of the previous stage and an output electrode for outputting the third control signal, and
a fourth transistor having a control electrode and an input electrode supplied commonly with the first clock signal and an output electrode for outputting the fourth control signal.

13. A shift register for driving row lines of a liquid crystal cell array, said shift register including a plurality of stages connected commonly to a signal generator for generating first to third clock signals each having a pulse enabled complementarily with respect to each other, said plurality of stages being connected to the row lines of the liquid crystal cell array and connected, in series, to a start signal input line for inputting a start pulse, wherein each $(3k)^{th}$ stage of said plurality of stages, wherein K is 0 or an integer, comprises:
a first output circuitry for responding to a first control signal to apply the first clock signal to the $(3k)^{th}$ row line of the liquid crystal cell array and for responding to a second control signal to discharge a voltage at the $(3k)^{th}$ row line of the liquid crystal cell array; and
a first input circuitry for responding to the start pulse and an output signal of the previous stage and the third clock signal to generate the first and second control signals, wherein each $(3k+1)^{th}$ stage of said plurality of stages comprises:
a second output circuitry for responding to a third control signal to apply the second clock signal to the $(3k+1)^{th}$ row line of the liquid crystal cell array and for responding to a fourth control signal to discharge a voltage at the $(3k+1)^{th}$ row line of the liquid crystal cell array; and
a second input circuitry for responding to the output signal of the previous stage and the first clock signal to generate the third and fourth control signals, and wherein each $(3k+2)^{th}$ stage of said plurality of stages comprises:
a third output circuitry for responding to a fifth control signal to apply the third clock signal to the $(3k+2)^{th}$ row line of the liquid crystal cell array and for responding to a sixth control signal to discharge a voltage at the $(3k+2)^{th}$ row line of the liquid crystal cell array; and
a third input circuitry for responding to the output signal of the previous stage and the second clock signal to generate the fifth and sixth control signals.

14. The shift register as claimed in claim 13, wherein said input circuitry included in the $(3k)^{th}$ stage comprises:
a first transistor having a control electrode supplied with the third clock signal, an input electrode supplied with one of the start pulse and the output signal of the previous stage and an output electrode for outputting the first control signal; and
a second transistor having a control electrode and an input electrode supplied commonly with the third clock signal and an output electrode for outputting the second control signal, wherein said input circuitry included in the $(3k+1)^{th}$ stage comprises:
a third transistor having a control electrode supplied with the first clock signal, an input electrode supplied with the output signal of the previous stage and an output electrode for outputting the third control signal; and a fourth transistor having a control electrode and an input electrode supplied commonly with the first clock signal and an output electrode for outputting the fourth control signal, and wherein said input circuitry included in the $(3k+2)^{th}$ stage comprises:

a fifth transistor having a control electrode supplied with the second clock signal, an input electrode supplied with the output signal of the previous stage and an output electrode for outputting the fifth control signal; and a sixth transistor having a control electrode and an input electrode supplied commonly with the second clock signal and an output electrode for outputting the sixth control signal.

15. The shift register as claimed in claim 13, wherein said input circuitry included in the $(3k)^{th}$ stage comprises:

a first transistor having a control electrode supplied with the third clock signal, an input electrode supplied with any one of the start pulse and the output signal of the previous stage and an output electrode for outputting the first control signal; and a second transistor having a control electrode supplied commonly with the third clock signal, an input electrode coupled with a high level supply voltage and an output electrode for outputting the second control signal, wherein said input circuitry included in the $(3k+1)^{th}$ stage comprises:

a third transistor having a control electrode supplied with the first clock signal, an input electrode supplied with the output signal of the previous stage and an output electrode for outputting the third control signal; and a fourth transistor having a control electrode supplied commonly with the first clock signal, an input electrode coupled with a high level supply voltage and an output electrode for outputting the fourth control signal, and wherein said input circuitry included in the $(3k+2)^{th}$ stage comprises:

a fifth transistor having a control electrode supplied with the second clock signal, an input electrode supplied with the output signal of the previous stage and an output electrode for outputting the fifth control signal; and a sixth transistor having a control electrode supplied commonly with the second clock signal, an input electrode coupled with a high level supply voltage and an output electrode for outputting the sixth control signal.

* * * * *